United States Patent
Wert

(10) Patent No.: US 6,683,485 B1
(45) Date of Patent: Jan. 27, 2004

(54) DOUBLE TRANSLATION VOLTAGE LEVEL SHIFTER AND METHOD

(75) Inventor: Joseph D. Wert, Arlington, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/004,747

(22) Filed: Dec. 4, 2001

(51) Int. Cl.$^7$ ................................................. H03L 5/00
(52) U.S. Cl. ......................................................... 327/333
(58) Field of Search ................................. 327/309, 310, 327/321, 333; 326/63, 68, 80–85

(56) References Cited

U.S. PATENT DOCUMENTS

| | | | |
|---|---|---|---|
| 5,578,957 A | * 11/1996 | Erhart et al. | 327/333 |
| 5,614,859 A | * 3/1997 | Ong | 326/80 |
| 5,808,480 A | * 9/1998 | Morris | 326/81 |
| 5,818,256 A | * 10/1998 | Usami | 326/68 |
| 6,384,628 B1 | * 5/2002 | Lacey et al. | 326/41 |

* cited by examiner

*Primary Examiner*—My-Trang Nu Ton

(57) ABSTRACT

A double translation voltage level shifter is provided that includes a first translator comprising thin-gate devices and a second translator comprising thick-gate devices. The first translator is operable to receive an internal power supply voltage associated with an internal voltage domain, to receive a transitional power supply voltage associated with a transitional voltage domain, and to receive internal data. The internal data comprises data in the internal voltage domain. The first translator is also operable to generate transitional data based on the internal data, the internal power supply voltage, and the transitional power supply voltage. The transitional data comprises data in the transitional voltage domain. The second translator is operable to receive an external power supply voltage associated with an external voltage domain. The second translator is also operable to generate external data based on the transitional data and the external power supply voltage. The external data comprises data in the external voltage domain.

19 Claims, 3 Drawing Sheets

US 6,683,485 B1

DOUBLE TRANSLATION VOLTAGE LEVEL SHIFTER AND METHOD

TECHNICAL FIELD OF THE INVENTION

The present invention is generally directed to integrated circuits and, in particular, to a double translation voltage level shifter and method.

BACKGROUND OF THE INVENTION

In recent years, there have been great advancements in the speed, power, and complexity of integrated circuits, such as application-specific integrated circuit (ASIC) chips, random access memory (RAM) chips, microprocessor (uP) chips, and the like. These advancements have made possible the development of system-on-a-chip (SOC) devices. A SOC device integrates into a single chip all (or nearly all) of the components of a complex electronic system, such as a wireless receiver (e.g., a cell phone, a television receiver, or the like). SOC devices greatly reduce the size, cost, and power consumption of the overall system.

Reductions in power consumption are particularly important in SOC devices. SOC devices are frequently used in portable devices that operate on battery power. Since maximizing battery life is a critical design objective in a portable device, it is essential to minimize the power consumption of SOC devices that may be used in the portable device. Furthermore, even if an SOC device is not used in a portable device, minimizing power consumption is still an important objective. The increased use of a wide variety of electronic products by consumers and businesses has caused corresponding increases in the electrical utility bills of homeowners and business operators. The increased use of electronic products also is a major contributor to the increased electrical demand that has caused highly publicized power shortages in the United States, particularly California.

To minimize power consumption in electronic devices, particularly SOC devices, many manufacturers have reduced the voltage levels at which electronic components operate. Low power integrated circuit (IC) technology operating at +3.3 volts replaced IC technology operating at +5.0 volts. The +3.3 volt IC technology was, in turn, replaced by +1.6 volt IC technology in many applications, particularly microprocessor and memory applications.

In deep sub-micron VLSI designs, two voltage sources for a chip design are common. One voltage source is an internal core power supply voltage that has a lower swing voltage than the second voltage source, which provides the output pad ring voltage. Common range values may include an internal source range of 1.0–1.5 volts and an external source range of 2.3–3.6 volts.

In order to use the lower core voltages effectively, the threshold voltages for the transistors are reduced. For example, the gate oxides may be thinned and the drain-to-source distances may be decreased to reduce threshold voltages for CMOS transistors. Reducing the threshold voltages in this way results in a decrease in the breakdown voltages of the lower threshold devices. Therefore, these thin-gate transistors operating at voltages of about 1.0 volt or lower have low voltage tolerances.

The internal core circuitry running on the internal source typically uses thin gate oxides and, thus, cannot tolerate the higher external voltages of 2.3–3.6 volts. The transistors used in the pad rings, which interface off the chip to the board and surrounding chips, use a thicker gate oxide and larger minimum L than internal transistors and hence can handle the larger external voltages. In order for the low voltage transistors to communicate across the boundary from the lower internal source to the higher external source, voltage level translation is used.

When chip technologies used internal voltages greater than 2 volts and external voltages were 3.3–5.5 volts, this level translation was relatively simple, and several different methodologies could be used. However, once internal voltages decreased to the 1 volt range, several of the previously used level translation methodologies could no longer be used. In addition, for internal voltages on the order of the threshold voltage of the thick-gate devices used in the pad rings, conventional level translation methodologies are unable to function across temperatures and transistor models. Thus, the threshold voltages of the thick-gate devices limit how much the internal voltage may be reduced and also affect performance in terms of speed.

SUMMARY OF THE INVENTION

In accordance with the present invention, a double translation voltage level shifter and method are provided that substantially eliminate or reduce disadvantages and problems associated with conventional systems and methods. In particular, a transitional power supply voltage that is less than an external power supply voltage and greater than an internal power supply voltage is introduced to allow voltage level shifting to be accomplished through a double translation.

According to one embodiment of the present invention, a double translation voltage level shifter is provided that includes a first translator comprising thin-gate devices and a second translator comprising thick-gate devices. The first translator is operable to receive an internal power supply voltage associated with an internal voltage domain, to receive a transitional power supply voltage associated with a transitional voltage domain, and to receive internal data. The internal data comprises data in the internal voltage domain. The first translator is also operable to generate transitional data based on the internal data, the internal power supply voltage, and the transitional power supply voltage. The transitional data comprises data in the transitional voltage domain. The second translator is operable to receive an external power supply voltage associated with an external voltage domain. The second translator is also operable to generate external data based on the transitional data and the external power supply voltage. The external data comprises data in the external voltage domain.

Technical advantages of one or more embodiments of the present invention include providing an improved double translation voltage level shifter. In a particular embodiment, a transitional power supply voltage that is less than an external power supply voltage and greater than an internal power supply voltage is included in the level shifter. As a result, a double translation method may be used to accomplish voltage level shifting for a wider internal-to-external voltage range. In addition, full speed may be maintained over the wider internal-to-external voltage range.

The first translation may be provided using thin-gate devices, and the second translation may be provided using thick-gate devices. Thin-gate devices have threshold voltages significantly less than thick-gate input/output transistors. Typically, the thin-gate devices have threshold voltages on the order of ¾ to ½ (and possibly even less) of the threshold voltages for thick-gate devices. Accordingly, threshold voltages of thick-gate devices associated with an external voltage domain do not limit how much the internal voltage may be reduced.

Other technical advantages will be readily apparent to one skilled in the art from the following figures, description, and claims.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, wherein like reference numerals represent like parts, in which.

DETAILED DESCRIPTION OF THE INVENTION

FIGS. 1 through 5, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged data processing system.

Figure 1:
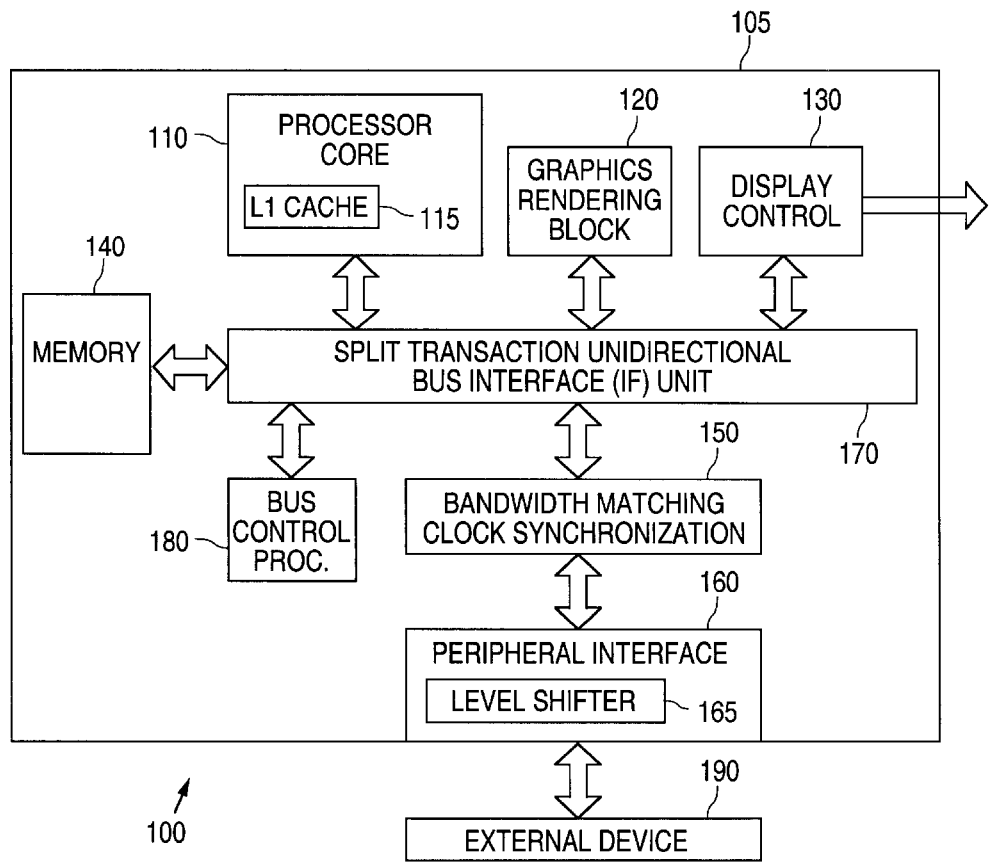
FIG. 1 is a block diagram illustrating a processing system which comprises a system-on-a-chip (SOC) device in accordance with one embodiment of the present invention.

FIG. 1 is a block diagram illustrating a processing system 100 which comprises a system-on-a-chip (SOC) device 105 in accordance with one embodiment of the present invention. The SOC device 105 is a single integrated circuit comprising a processor core 110, an optional graphics rendering block 120, an optional display control circuit 130, a memory 140, a bandwidth-matching clock synchronization interface 150, a peripheral interface 160, a split transaction, unidirectional bus interface (IF) unit 170 (or bus IF unit 170), and a bus control processor 180. The processor core 110 comprises an internal level one (L1) cache 115. The peripheral interface 160 comprises a level shifter 165 and is operable to communicate with an external device 190.

The processing system 100 is shown in a general level of detail because it is intended to represent any one of a wide variety of electronic products, particularly consumer appliances. The graphics rendering block 120 and the display controller 130 are optional in that not all end-products require the use of a display.

For example, the processing system 100 may comprise a printer rendering system for use in a conventional laser printer. The processing system 100 also may comprise selected portions of video and audio compression-decompression circuitry for a video playback system, such as a videocassette recorder or a digital versatile disk (DVD) player. In another alternative embodiment, the processing system 100 may comprise selected portions of a cable television set-top box or a stereo receiver.

The peripheral interface 160 comprises a bus device that is operable to provide chip-to-chip communication between the SOC device 105 and any suitable external peripheral device, such as the external device 190. The level shifter 165 comprises voltage level shifting circuitry (or voltage translation circuitry) that is operable to permit logic gates in one voltage domain to communicate with logic gates in another voltage domain.

As described in more detail below in connection with FIGS. 2–5, the level shifter 165 comprises a double translation voltage level shifter that is operable to perform a double translation such that data from logic gates in an internal voltage domain is translated into a transitional voltage domain before being translated into an external voltage domain. According to the illustrated embodiment, the level shifter 165 is implemented in the peripheral interface 160. However, it will be understood that the level shifter 165 may be implemented in any one or more suitable components of the SOC device 105 without departing from the scope of the present invention.

The bus IF unit 170 is operable to provide high-speed, low-latency communication paths between the components coupled to the bus IF unit 170. According to one embodiment, each component coupled to the bus IF unit 170 is capable of initiating or servicing data requests via four unidirectional bus interfaces: two request buses and two data buses. The request bus contains address lines, byte enable lines (32-bit or 64-bit data reads), cycle type lines, and routing information for transactions. The data bus contains data lines, byte enable lines (for data writes), completion status lines, and routing information to associate the data bus packets with the appropriate request bus packet. The four buses are unidirectional and point-to-point to minimize loading and timing variations. In addition, the bus IF unit 170 is operable to provide a diagnostic bus, power management controls, clocks, reset signals, and a scan interface.

The bus IF unit 170 is operable to implement a transaction protocol that defines the mechanism for transferring packets between devices coupled to the bus IF unit 170. In addition, the transaction protocol defines the control for clocks and power management. The packet protocol standardizes the system level interactions between devices coupled to the bus IF unit 170. The hardware requirements for mapping transactions, arbitrating packets, and maintaining coherency is specified in the packet protocol.

The bandwidth-matching clock synchronization interface 150 comprises a queue that is operable to bridge ports on the bus IF unit 170 that have different widths and/or different frequencies.

The bus control processor 180 is operable to control certain operations of the bus IF unit 170 related to clock timing, power management, and diagnostic features.

In one embodiment of the present invention, the SOC device 105 is operable to use two power supplies: an internal power supply voltage (VDD) to power internal logic and an external power supply voltage (VDDI/O) to power input/output (I/O) lines that interface with external circuitry. For example, the processor core 110 and the bus IF unit 170 may operate at VDD, and the output stage of the peripheral interface 160 may operate at VDDI/O.

Additionally, VDDI/O circuitry may be used within the SOC device 105 to drive selected internal address and data lines. For example, if the memory 140 is large and separated from the bus IF unit 170, the address and data lines of the memory 140 may be driven by VDDI/O. For this embodiment, the level shifter 165 is operable to interface the VDD logic gates in the SOC device 105 and the VDDI/O logic gates in the SOC device 105. Thus, the level shifter 165 is operable to receive data signals from internal logic gates in the SOC device 105 that operate at VDD and to output the data signals at VDDI/O either for an external device 190 or for internal circuitry operating at VDDI/O.

Figure 2:
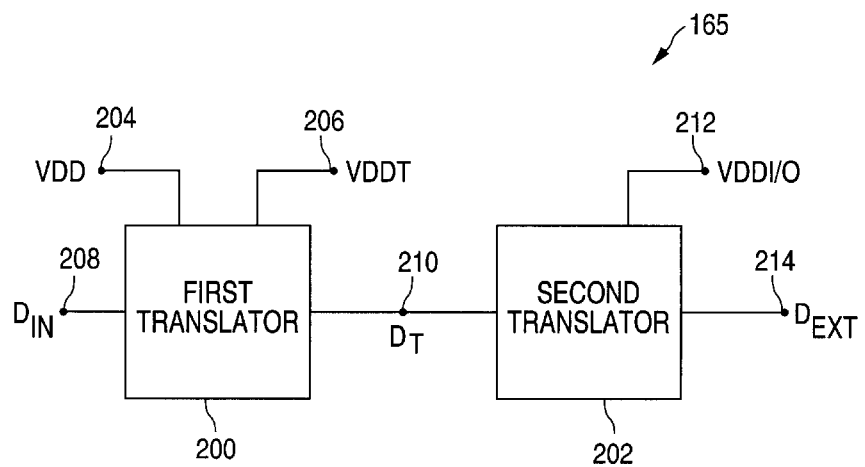
FIG. 2 is a block diagram illustrating the level shifter of FIG. 1 in accordance with one embodiment of the present invention.

FIG. 2 is a block diagram illustrating the level shifter 165 in accordance with one embodiment of the present invention. The level shifter 165 comprises a first translator 200 and a second translator 202. The first translator 200 is operable to receive an internal power supply voltage, VDD 204, that is associated with an internal voltage domain, and a transitional power supply voltage, VDDT 206, that is associated with a transitional voltage domain.

The internal voltage domain comprises a swing voltage based on VDD 204. For example, if a ground potential for the level shifter 165 provides about 0 volts, the swing voltage for the internal voltage domain corresponds to the power supply voltage provided by VDD 204. According to one embodiment, VDD 204 provides less than about 1.0 volts. In another embodiment, VDD 204 provides less than about 0.7 volts. However, it will be understood that VDD 204 may provide any suitable internal power supply voltage without departing from the scope of the present invention.

The transitional voltage domain comprises a swing voltage based on VDDT 206. For example, if a ground potential for the level shifter 165 provides about 0 volts, the swing voltage for the transitional voltage domain corresponds to the power supply voltage provided by VDDT 206. According to one embodiment, VDDT 206 provides about 1.8 volts. However, it will be understood that VDDT 206 may provide any suitable transitional power supply voltage without departing from the scope of the present invention.

The first translator 200 is also operable to receive internal data 208 in the internal voltage domain and, using VDD 204 and VDDT 206, to generate transitional data 210 in the transitional voltage domain based on the internal data 208.

The second translator 202 is operable to receive an external power supply voltage, VDDI/O 212, that is associated with an external voltage domain, and to receive the transitional data 210 generated by the first translator 200.

The external voltage domain comprises a swing voltage based on VDDI/O 212. For example, if a ground potential for the level shifter 165 provides about 0 volts, the swing voltage for the external voltage domain corresponds to the power supply voltage provided by VDDI/O 212. According to one embodiment, VDDI/O 212 provides more than about 2.3 volts. In another embodiment, VDDI/O 212 provides more than about 3.3 volts. In still another embodiment, VDDI/O 212 provides more than about 3.6 volts. However, it will be understood that VDDI/O 212 may provide any suitable external power supply voltage without departing from the scope of the present invention.

According to one embodiment, VDD 204 may provide a power supply voltage that is less than twice the threshold voltage for transistors operating in the external voltage domain. VDDT 206 provides a power supply voltage that is less than that provided by VDDI/O 212 and greater than that provided by VDD 204.

According to one embodiment, VDDT 206 provides a transitional power supply voltage corresponding to a specified percentage of the external power supply voltage provided by VDDI/O 212. For example, VDDT 206 may provide a transitional power supply voltage that is about 50% of the external power supply voltage provided by VDDI/O 212. However, it will be understood that VDDT 206 may provide a transitional power supply voltage corresponding to any suitable percentage of the external power supply voltage provided by VDDI/O 212 without departing from the scope of the present invention.

The second translator 202 is also operable, using VDDI/O 212, to generate external data 214 in the external voltage domain based on the transitional data 210 generated by the first translator 200.

Figure 3:
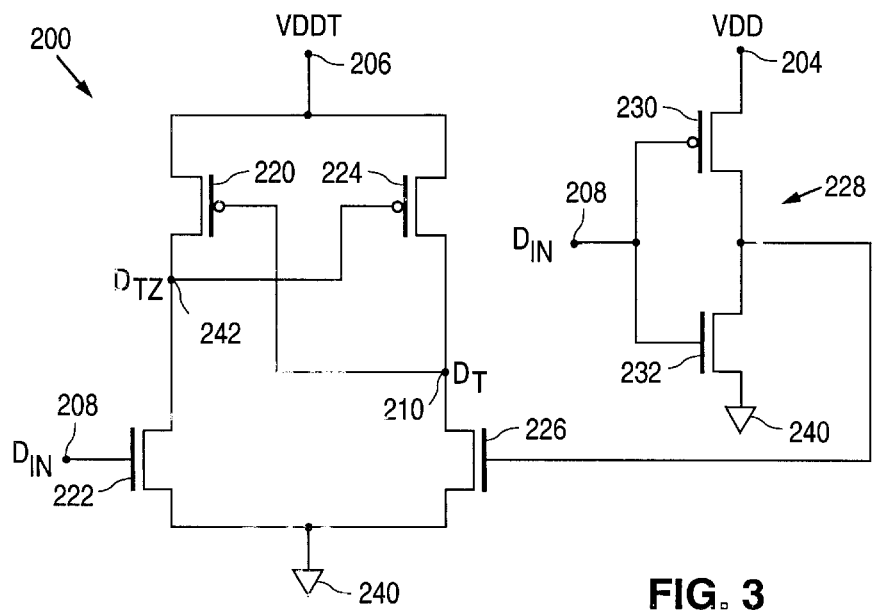
FIG. 3 is a circuit diagram illustrating the first translator of FIG. 2 in accordance with one embodiment of the present invention.

FIG. 3 is a circuit diagram illustrating the first translator 200 in accordance with one embodiment of the present invention. The first translator 200 comprises a first circuit branch comprising a series connection of a p-type transistor 220 and an n-type transistor 222 and a second circuit branch comprising a series connection of a p-type transistor 224 and an n-type transistor 226. The drains of transistors 220 and 222 are coupled together, and the drains of transistors 224 and 226 are coupled together. The first translator 200 also comprises an inverter 228 comprising a series connection of a p-type transistor 230 and an n-type transistor 232.

The two circuit branches are operable to function between VDDT 206 and ground 240. The inverter 228 is operable to function between VDD 204 and ground 240. In accordance with one embodiment of the present invention, transistors 220, 222, 224, 226, 230 and 232 each comprise a thin-gate device. As used herein, "thin-gate device" means a device having a maximum gate thickness of about 90 angstroms. For one embodiment, the thing ate devices may have a gate thickness of about 70 angstroms.

In operation, the inverter 228 inverts an internal data signal 208 and applies the inverted value to the gate of transistor 226. Thus, if the internal data signal 208 is Logic 1 in the internal voltage domain, transistor 222 is turned ON and transistor 226 is OFF. The drain of transistor 222 and the gate of transistor 224 are pulled down to ground 240, or Logic 0. This turns transistor 224 ON and sets the transitional data signal 210 to Logic 1.

Because the circuit branches operate at VDDT 206, the Logic 1 generated for the transitional data signal 210 is in the transitional voltage domain. Thus, for the embodiment in which VDDT 206 is 1.8 volts, the transitional data signal 210 comprises a signal of about 1.8 volts. Also, since transistor 224 is ON based on the inverted transitional data signal 242 of Logic 0 and transistor 226 is OFF, the gate of transistor 220 is pulled up to VDDT 206 by transistor 224 and hence transistor 220 is OFF.

Similarly, if the internal data signal 208 is Logic 0, transistor 222 is turned OFF and transistor 226 is ON. The drain of transistor 226 and the gate of transistor 220 are pulled down to ground 240, or Logic 0. In this situation, the transitional data signal 210 is set to Logic 0. This turns transistor 220 ON and pulls the gate of transistor 224 up to VDDT 206 through the inverted transitional data signal 242 of Logic 1.

Figure 4:
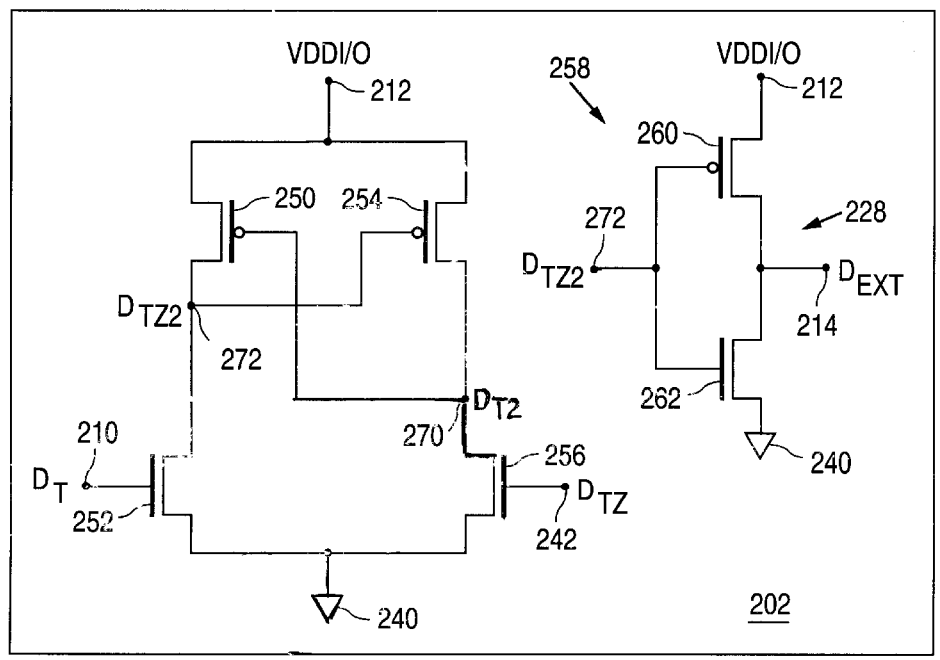
FIG. 4 is a circuit diagram illustrating the second translator of FIG. 2 in accordance with one embodiment of the present invention.

FIG. 4 is a circuit diagram illustrating the second translator 202 in accordance with one embodiment of the present invention. The second translator 202 comprises a first circuit branch comprising a series connection of a p-type transistor 250 and an n-type transistor 252 and a second circuit branch comprising a series connection of a p-type transistor 254 and an n-type transistor 256. The drains of transistors 250 and 252 are coupled together, and the drains of transistors 254 and 256 are coupled together. The second translator 202 also comprises an inverter 258 comprising a series connection of a p-type transistor 260 and an n-type transistor 262.

The two circuit branches and the inverter 258 are operable to function between VDDI/O 212 and ground 240. In accordance with one embodiment of the present invention, transistors 250, 252, 254, 256, 260 and 262 each comprise a thick-gate device. As used herein, "thick-gate device" means a device having a minimum gate thickness of about 110 angstroms. For one embodiment, the thick-gate devices may have a gate thickness of about 130 angstroms.

In operation, if the transitional data signal 210 is Logic 1 in the transitional voltage domain, transistor 252 is turned ON and transistor 256, which receives the inverted transitional data signal 242, is OFF. The drain of transistor 252 and the gate of transistor 254 are pulled down to ground 240, or Logic 0. This turns transistor 254 ON and sets a second transitional data signal 270 to Logic 1.

Because the circuit branches operate at VDDI/O 212, the Logic 1 generated for the second transitional data signal 270 is in the external voltage domain. Thus, for the embodiment in which VDDI/O 212 is 3.6 volts, the second transitional data signal 270 comprises a signal of about 3.6 volts. Also, since transistor 254 is ON based on the inverted second transitional data signal 272 of Logic 0 and transistor 256 is OFF, the gate of transistor 250 is pulled up to VDDI/O 212 by transistor 254 and hence transistor 250 is OFF.

The inverter 258 inverts the second transitional data signal 272 of Logic 0 in order to generate an external data signal 214 of Logic 1, which is also in the external voltage domain due to the inverter 258 operating at VDDI/O 212.

Similarly, if the transitional data signal 210 is Logic 0, transistor 252 is turned OFF and transistor 256 is ON. The drain of transistor 256 and the gate of transistor 250 are pulled down to ground 240, or Logic 0. In this situation, the second transitional data signal 270 is set to Logic 0. This turns transistor 250 ON and pulls the gate of transistor 254 up to VDDI/O 212 through the inverted second transitional data signal 272 of Logic 1. The inverter 258 inverts the second transitional data signal 272 of Logic 1 in order to generate an external data signal 214 of Logic 0.

Thus, the internal data 208 comprises a ground 240 to VDD 204 logic signal that is translated by the first translator 200 to transitional data 210 comprising a ground 240 to VDDT 206 logic signal through the use of VDD 204 and VDDT 206. The transitional data 210 is then translated by the second translator 202 to external data 214 comprising a ground 240 to VDDI/O 212 logic signal through the use of VDDI/O 212.

Figure 5:
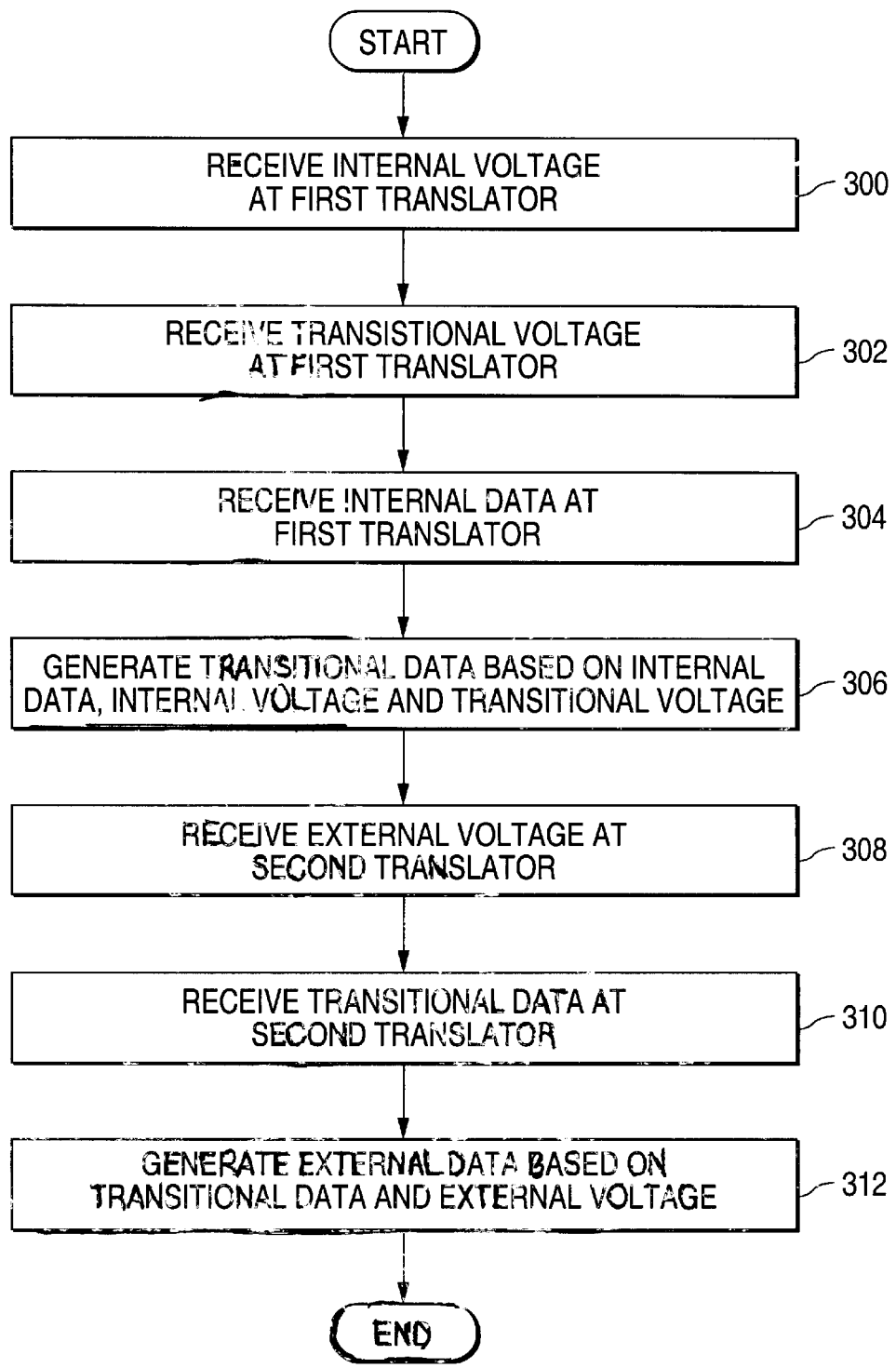
FIG. 5 is a flow diagram illustrating a method for performing a double translation voltage level shift using the level shifter of FIG. 2 in accordance with one embodiment of the present invention.

FIG. 5 is a flow diagram illustrating a method for performing a double translation voltage level shift using the level shifter 165 in accordance with one embodiment of the present invention. The method begins at step 300 where the internal power supply voltage VDD 204 is received at the first translator 200. At step 302, the transitional power supply voltage VDDT 206 is received at the first translator 200.

At step 304, internal data 208 is received at the first translator 200. At step 306, the first translator 200 generates transitional data 210 based on the internal data 208, the internal power supply voltage VDD 204, and the transitional power s supply voltage VDDT 206 through the use of thin-gate devices.

At step 308, the external power supply voltage VDDI/O 212 is received at the second translator 202. At step 310, the transitional data 210 generated by the first translator 200 is received at the second translator 202. At step 312, the second translator 202 generates external data 214 based on the transitional data 210 and the external power supply voltage VDDI/O 212 through the use of thick-gate devices.

In this way, internal data 208 in an internal voltage domain may be translated by thin-gate devices into transitional data 210 in a transitional voltage domain using VDD 204 and VDDT 206, and the transitional data 210 may be translated by thick-gate devices into external data 214 in an external voltage domain using VDDI/O 212. Thus, using this double translation voltage level shift, internal data 208 that is in an internal voltage domain that is significantly reduced as compared to the external voltage domain may be translated into external data 214 in the external voltage domain despite the difference between the domains.

Although the present invention has been described with several embodiments, various changes and modifications may be suggested to one skilled in the art. It is intended that the present invention encompass such changes and modifications as fall within the scope of the appended claims.

What is claimed is:

1. A double translation voltage level shifter, comprising:
   a first translator comprising thin-gate devices, the first translator operable to receive an internal power supply voltage associated with an internal voltage domain, to receive a transitional power supply voltage associated with a transitional voltage domain, to receive internal data, the internal data comprising data in the internal voltage domain, and to generate transitional data based on the internal data, the internal power supply voltage, and the transitional power supply voltage, the transitional data comprising data in the transitional voltage domain; and
   a second translator comprising thick-gate devices, the second translator operable to receive an external power supply voltage associated with an external voltage domain and to generate external data based on the transitional data and the external power supply voltage, the external data comprising data in the external voltage domain.

2. The level shifter of claim 1, the first translator comprising:
   a first circuit branch comprising A) a first p-type transistor having a source coupled to the transitional power supply voltage and B) a first n-type transistor having a source coupled to ground, a drain coupled to a drain of the first p-type transistor, and a gate operable to receive the internal data;

a second circuit branch comprising A) a second p-type transistor having a source coupled to the transitional power supply voltage and a gate coupled to a drain of the first n-type transistor and B) a second n-type transistor having a source coupled to ground and a drain coupled to a drain of the second p-type transistor and to a gate of the first p-type transistor; and an inverter coupled to the internal power supply voltage and to a gate of the second n-type transistor, the inverter operable to receive the internal data and to provide inverted internal data to the gate of the second n-type transistor.

3. The level shifter of claim 1, the second translator comprising:

a first circuit branch comprising A) a first p-type transistor having a source coupled to the external power supply voltage and B) a first n-type transistor having a source coupled to ground, a drain coupled to a drain of the first p-type transistor, and a gate operable to receive the transitional data;

a second circuit branch comprising A) a second p-type transistor having a source coupled to the external power supply voltage and a gate coupled to a drain of the first n-type transistor and B) a second n-type transistor having a source coupled to ground and a drain coupled to a drain of the second p-type transistor and to a gate of the first p-type transistor; and an inverter coupled to the external power supply voltage and to the drain of the first n-type transistor, the inverter operable to generate the external data based on a signal received from the drain of the first n-type transistor.

4. The level shifter of claim 1, the transitional voltage domain comprising a swing voltage of about 50% of a swing voltage for the external voltage domain.

5. The level shifter of claim 1, the internal voltage domain comprising a swing voltage of less than 1.0 volt, the external voltage domain comprising a swing voltage of at least 3.3 volts.

6. The level shifter of claim 1, the internal voltage domain comprising a swing voltage of less than 0.7 volts, the external voltage domain comprising a swing voltage of at least 3.6 volts.

7. The level shifter of claim 1, the internal voltage domain comprising a swing voltage of less than twice a threshold voltage for the thick-gate devices of the second translator.

8. An integrated circuit comprising:

core processing circuitry operable to function in an internal voltage domain;

output stage circuitry operable to function in an external voltage domain; and a double translation voltage level shifter comprising:

a first translator comprising thin-gate devices, the first translator operable to receive an internal power supply voltage associated with the internal voltage domain, to receive a transitional power supply voltage associated with a transitional voltage domain, to receive internal data, the internal data comprising data in the internal voltage domain, and to generate transitional data based on the internal data, the internal power supply voltage, and the transitional power supply voltage, the transitional data comprising data in the transitional voltage domain, and a second translator comprising thick-gate devices, the second translator operable to receive an external power supply voltage associated with the external voltage domain and to generate external data based on the transitional data and the external power supply voltage, the external data comprising data in the external voltage domain.

9. The integrated circuit of claim 8, the first translator of the level shifter comprising:

a first circuit branch comprising A) a first p-type transistor having a source coupled to the transitional power supply voltage and B) a first n-type transistor having a source coupled to ground, a drain coupled to a drain of the first p-type transistor, and a gate operable to receive the internal data;

a second circuit branch comprising A) a second p-type transistor having. a source coupled to the transitional power supply voltage and a gate coupled to a drain of the first n-type transistor and B) a second n-type transistor having a source coupled to ground and a drain coupled to a drain of the second p-type transistor and to a gate of the first p-type transistor; and an inverter coupled to the internal power supply voltage and to a gate of the second n-type transistor, the inverter operable to receive the internal data and to provide inverted internal data to the gate of the second n-type transistor.

10. The integrated circuit of claim 8, the second translator of the level shifter comprising:

a first circuit branch comprising A) a first p-type transistor having a source coupled to the external power supply voltage and B) a first n-type transistor having a source coupled to ground, a drain coupled to a drain of the first p-type transistor, and a gate operable to receive the transitional data;

a second circuit branch comprising A) a second p-type transistor having a source coupled to the external power supply voltage and a gate coupled to a drain of the first n-type transistor and B) a second n-type transistor having a source coupled to ground and a drain coupled to a drain of the second p-type transistor and to a gate of the first p-type transistor; and an inverter coupled to the external power supply voltage and to the drain of the first n-type transistor, the inverter operable to generate the external data based on a signal received from the drain of the first n-type transistor.

11. The integrated circuit of claim 8, the transitional voltage domain comprising a swing voltage of about 50% of a swing voltage for the external voltage domain.

12. The integrated circuit of claim 8, the internal voltage domain comprising a swing voltage of less than 1.0 volt, the external voltage domain comprising a swing voltage of at least 3.3 volts.

13. The integrated circuit of claim 8, the internal voltage domain comprising a swing voltage of less than 0.7 volts, the external voltage domain comprising a swing voltage of at least 3.6 volts.

14. The integrated circuit of claim 8, the internal voltage domain comprising a swing voltage of less than twice a threshold voltage for the thick-gate devices of the second translator.

15. A method of performing a double translation voltage level shift, comprising:

receiving an internal power supply voltage associated with an internal voltage domain;

receiving a transitional power supply voltage associated with a transitional voltage domain;

receiving an external power supply voltage associated with an external voltage domain;

receiving internal data, the internal data comprising data in the internal voltage domain;

generating transitional data using thin-gate devices based on the internal data, the internal power supply voltage, and the transitional power supply voltage, the transitional data comprising data in the transitional voltage domain; and generating external data using thick-gate devices based on the transitional data and the external power supply voltage, the external data comprising data in the external voltage domain.

16. The method of claim 15, the transitional voltage domain comprising a swing voltage of about 50% of a swing voltage for the external voltage domain.

17. The method of claim 15 the internal voltage domain comprising a swing voltage of less than 1.0 volt, the external voltage domain comprising a swing voltage of at least 3.3 volts.

18. The method of claim 15, the internal voltage domain comprising a swing voltage of less than 0.7 volts, the external voltage domain comprising a swing voltage of at least 3.6 volts.

19. The method of claim 15, the internal voltage domain comprising a swing voltage of less than twice a threshold voltage for the thick-gate devices.

* * * * *

UNITED STATES PATENT AND TRADEMARK OFFICE
CERTIFICATE OF CORRECTION

PATENT NO. : 6,683,485 B1
DATED : January 27, 2004
INVENTOR(S) : Wert

It is certified that error appears in the above-identified patent and that said Letters Patent is hereby corrected as shown below:

Column 10,
Line 14, remove the period "." after the word "having".

Signed and Sealed this

Twenty-eighth Day of September, 2004

JON W. DUDAS
*Director of the United States Patent and Trademark Office*